United States Patent
Kim et al.

(10) Patent No.: US 9,994,737 B2
(45) Date of Patent: Jun. 12, 2018

(54) SLURRY COMPOUNDS AND METHODS OF FABRICATING SEMICONDUCTOR DEVICES USING THE SAME

(71) Applicant: Samsung Electronics Co., Ltd., Suwon-si, Gyeonggi-do (KR)

(72) Inventors: Sangkyun Kim, Hwaseong-si (KR); Yun-Jeong Kim, Suwon-si (KR); SeungHo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/389,800

(22) Filed: Dec. 23, 2016

(65) Prior Publication Data
US 2017/0107405 A1    Apr. 20, 2017

Related U.S. Application Data

(62) Division of application No. 14/864,322, filed on Sep. 24, 2015, now abandoned.

(30) Foreign Application Priority Data

Nov. 14, 2014  (KR) .......................... 10-2014-0159064

(51) Int. Cl.
| | | |
|---|---|---|
| *H01L 21/02* | (2006.01) | |
| *C09G 1/02* | (2006.01) | |
| *H01L 21/3105* | (2006.01) | |
| *H01L 21/768* | (2006.01) | |

(52) U.S. Cl.
CPC .......... *C09G 1/02* (2013.01); *H01L 21/02126* (2013.01); *H01L 21/31055* (2013.01); *H01L 21/31058* (2013.01); *H01L 21/7682* (2013.01); *H01L 21/76819* (2013.01); *H01L 21/76837* (2013.01); *H01L 21/76895* (2013.01)

(58) Field of Classification Search
CPC ................ C09G 1/02; H01L 21/76895; H01L 21/02126; H01L 21/31055; H01L 21/7682; H01L 21/76819; H01L 21/76837; H01L 21/31058
See application file for complete search history.

(56) References Cited

U.S. PATENT DOCUMENTS

| | | |
|---|---|---|
| 6,815,329 B2 | 11/2004 | Babich et al. |
| 7,566,656 B2 | 7/2009 | Liu et al. |
| 7,666,754 B2 | 2/2010 | Toma et al. |
| 7,892,966 B2 | 2/2011 | Won et al. |
| 8,344,474 B2 | 1/2013 | Seidel et al. |
| 2002/0095872 A1 | 7/2002 | Tsuchiya et al. |

(Continued)

FOREIGN PATENT DOCUMENTS

| | | |
|---|---|---|
| JP | 2011503840 A | 1/2011 |
| JP | 4817649 B2 | 11/2011 |

(Continued)

*Primary Examiner* — Duy Deo
*Assistant Examiner* — Mahmoud Dahimene
(74) *Attorney, Agent, or Firm* — Ward and Smith, P.A.

(57) ABSTRACT

Provided are slurry compounds for polishing an SOH organic layer and methods of fabricating a semiconductor device using the same. The slurry compound may include a polishing particle, an oxidizing agent including at least one selected from the group consisting of a nitrate, a sulfate, a chlorate, a perchlorate, a chlorine, and a peroxide, and a polishing accelerator.

7 Claims, 8 Drawing Sheets

(56) References Cited

U.S. PATENT DOCUMENTS

| | | |
|---|---|---|
| 2005/0127514 A1 | 6/2005 | Chen et al. |
| 2006/0211235 A1 | 9/2006 | Usami |
| 2008/0124917 A1* | 5/2008 | Oh .................... H01L 21/76885 |
| | | 438/637 |
| 2010/0015807 A1 | 1/2010 | Kim et al. |
| 2014/0065813 A1 | 3/2014 | Horak et al. |
| 2015/0004788 A1 | 1/2015 | Shi et al. |
| 2015/0021513 A1* | 1/2015 | Kim .................... C09K 3/1463 |
| | | 252/79.4 |

FOREIGN PATENT DOCUMENTS

| | | |
|---|---|---|
| JP | 5204370 B2 | 6/2013 |
| KR | 0288506 | 2/2001 |
| KR | 100391587 B1 | 7/2003 |
| KR | 20050005543 A | 1/2005 |
| KR | 100843233 B1 | 7/2008 |
| KR | 20130090505 A | 8/2013 |
| KR | 1020150009914 A | 1/2015 |
| KR | 1020150010570 A | 1/2015 |

* cited by examiner

SLURRY COMPOUNDS AND METHODS OF FABRICATING SEMICONDUCTOR DEVICES USING THE SAME

CROSS-REFERENCE TO RELATED APPLICATIONS

This application is a divisional of and claims priority to U.S. application Ser. No. 14/864,322, filed on Sep. 24, 2015, which claims priority under 35 U.S.C. § 119 to Korean Patent Application No. 10-2014-0159064, filed on Nov. 14, 2014. The contents of each are incorporated herein by reference in their entirety.

FIELD

Example embodiments of the inventive concept relate to slurry compounds and methods of fabricating a semiconductor device using the same, and in particular, to methods of electrically isolating metal lines from each other by an air gap using the slurry compounds.

BACKGROUND

At least due to their small-size, multifunctionality, and/or low-cost characteristics, semiconductor devices are considered important elements in the electronic industry. The semiconductor devices can be generally classified into a memory device for storing data, a logic device for processing data, and a hybrid device capable of performing various functions.

There is an increasing demand for a semiconductor device with a higher integration density and higher performance. Although a variety of studies are being conducted to meet such a demand, it is desired to reduce a process margin (for example, in a photolithography process) and this may lead to several difficulties in fabricating a semiconductor device.

SUMMARY

Example embodiments of the inventive concept provide a slurry compound, allowing a polishing process to be effectively used in fabrication of a highly-integrated semiconductor device.

Other example embodiments of the inventive concept provide a method of fabricating a highly-integrated semiconductor device.

According to example embodiments of the inventive concept, a slurry compound for polishing a spin-on-hardmask (SOH) organic layer may include a polishing particle, an oxidizing agent containing at least one selected from the group consisting of nitrate, sulfate, chlorate, perchlorate, chlorine, and peroxide, and a polishing accelerator.

In example embodiments, the polishing particle may include colloidal ceria ($CeO_2$) particles.

In example embodiments, the polishing particle may have a size ranging from about 30 nm to about 80 nm.

In example embodiments, the oxidizing agent may be contained in the slurry compound to have a content ranging from about 0.2 wt % to about 0.7 wt % with respect to a total weight of the slurry compound.

In example embodiments, the oxidizing agent may include at least one of hydrogen peroxide, ammonium perchlorate, sodium chlorate, sodium chlorite, or ferric nitrate.

In example embodiments, the polishing accelerator may be adsorbed on a surface of a metal to protect the metal against corrosion.

In example embodiments, the polishing accelerator may include at least one an amino acid selected from the group consisting of histidine, glycine, glutamine, leucine, methionine, phenylalanine, tryptophan, and valine.

In example embodiments, the polishing accelerator may include at least one selected from the group consisting of imidazole, imidazolium, chloride, pyridine, tetrazoles, histamine, 1,3-dimethylxanthine, 6-mercaptopurine, 1H-1,2,3-triazole, 1H-1,2,4-triazole, poly-[2,2'-(m-phenylen)-5,5'-bisbenzimidazole], 1H-Pyrrole, 1,3-oxazole, 1,3-thiazole, Pyrazole, 1-Methylimidazole, and 4-Methyl-1H-imidazole.

According to example embodiments of the inventive concept, a method of fabricating a semiconductor device may include forming metal lines on a substrate, forming an SOH organic layer on the metal lines to fill gaps between the metal lines, performing a polishing process on the SOH organic layer to expose top surfaces of the metal lines and form SOH organic patterns between the metal lines, forming a thin film on the metal lines and the SOH organic patterns, and selectively removing the SOH organic patterns to form air gaps between the metal lines. The polishing process may be performed using a slurry compound including a polishing particle, an oxidizing agent containing at least one selected from the group consisting of nitrate, sulfate, chlorate, perchlorate, chlorine, and peroxide, and a polishing accelerator.

In example embodiments, during the polishing process on the SOH organic layer, the polishing accelerator of the slurry compound may be adsorbed on top surfaces of the metal lines.

In example embodiments, the polishing particle may include colloidal ceria ($CeO_2$) particles.

In example embodiments, the polishing particle may have a size ranging from about 30 nm to about 80 nm.

In example embodiments, the oxidizing agent may be contained in the slurry compound to have a content ranging from about 0.2 wt % to about 0.7 wt % with respect to a total weight of the slurry compound.

In example embodiments, the oxidizing agent may include at least one of hydrogen peroxide, ammonium perchlorate, sodium chlorate, sodium chlorite, or ferric nitrate.

In example embodiments, the polishing accelerator may include at least one amino acid selected from the group consisting of histidine, glycine, glutamine, leucine, methionine, phenylalanine, tryptophan, and valine.

In example embodiments, the polishing accelerator may include at least one selected from the group consisting of imidazole, imidazolium, chloride, pyridine, tetrazoles, histamine, 1,3-dimethylxanthine, 6-mercaptopurine, 1H-1,2,3-triazole, 1H-1,2,4-triazole, poly-[2,2'-(m-phenylen)-5,5'-bisbenzimidazole], 1H-Pyrrole, 1,3-oxazole, 1,3-thiazole, Pyrazole, 1-Methylimidazole, and 4-Methyl-1H-imidazole.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
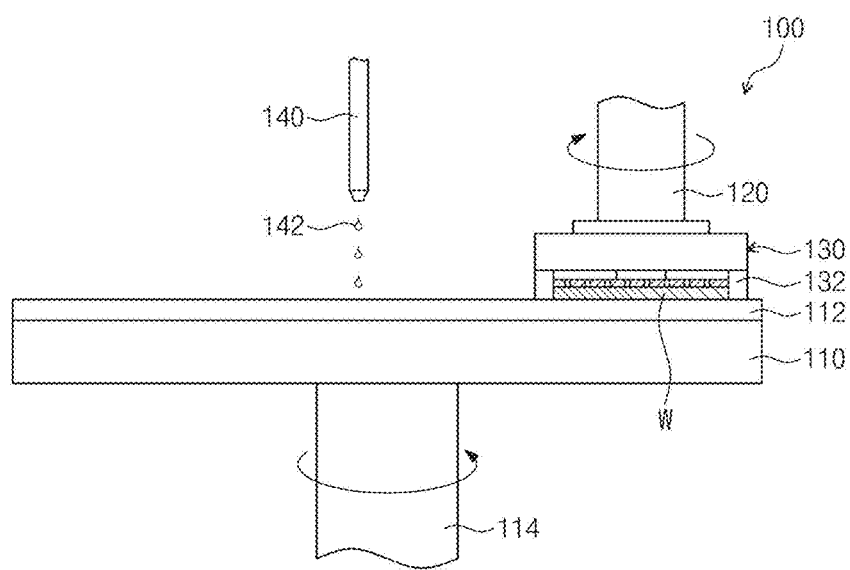
FIG. 1 is a sectional view schematically illustrating a chemical mechanical polishing apparatus.

It should be noted that these figures are intended to illustrate the general characteristics of methods, structure and/or materials utilized in certain example embodiments and to supplement the written description provided below. These drawings should not be interpreted as defining or limiting the range of values or properties encompassed by example embodiments.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Slurry Compound]

A slurry compound according to example embodiments of the inventive concept may have a higher polishing rate on spin-on-hardmask (SOH) organic materials, compared with that of a metal or a nitride. For example, in the case where a copper-containing metal layer and an organic SOH containing layer are polished along with each other, the usage of the slurry compound may make it possible to suppress the copper-containing metal layer from being polished. Alternatively, in the case where a silicon nitride layer and an organic SOH containing layer are polished along with each other, the usage of the slurry compound may make it possible to suppress the silicon nitride layer from being polished.

According to example embodiments of the inventive concept, the slurry compound may include polishing particles, an oxidizing agent, and a polishing accelerator.

The polishing particle may include a material having a higher polishing rate on the SOH organic material than those on a metal or a silicon nitride. The polishing particle may include at least one of silica ($SiO_2$), ceria ($CeO_2$), or alumina ($Al_2O_3$). Further, the polishing particle may be provided in a colloidal, fumed, or calcination shape. The polishing particle may have a size ranging from about 30 nm to about 80 nm. In the case where the size of the polishing particle is less than 30 nm, there is generally difficulty in performing mechanical polishing effectively, whereas in the case where the size of the polishing particle is greater than 80 nm, the SOH organic material may be damaged during the polishing process.

The oxidizing agent may oxidize a polymer contained in the SOH organic material and enhance hydrophilicity of the SOH organic material. The oxidizing agent may include a material having dispersion stability for the polishing particle and a high polishing rate for the SOH organic material.

The oxidizing agent may include at least one selected from the group consisting of nitrate, sulfate, chlorate, perchlorate, chlorine, and peroxide. For example, the oxidizing agent may include at least one of hydrogen peroxide, ammonium perchlorate, sodium chlorate, sodium chlorite, and ferric nitrate. The oxidizing agent may be contained in the slurry compound to have a content ranging from about 0.2 wt % to about 0.7 wt % with respect to a total weight of the slurry compound. In the case where the content of the oxidizing agent is less than about 0.2 wt %, it may be more difficult to polish an SOH organic material with efficiency, whereas in the case where the content of the oxidizing agent is higher than about 0.7 wt %, dispersion stability between the oxidizing agent and the polishing particle may be deteriorated.

The polishing accelerator may be selected to preserve a highly activated state of the oxidizing agent and thereby polish the SOH organic material with a higher polishing rate. Further, the polishing accelerator may have a metal-corrosion inhibiting property and/or a metal passivating property. For example, the polishing accelerator may be adsorbed on a surface of a metal layer, thereby protecting the metal layer from metal corrosion and allowing the SOH organic material to be polished with a high polishing selectivity with respect to the metal layer. The polishing accelerator may include at least one amino acid selected from the group consisting of histidine, glycine, glutamine, leucine, methionine, phenylalanine, tryptophan, and valine. For example, the polishing accelerator may include at least one selected from the group consisting of imidazole, imidazolium, chloride, pyridine, tetrazoles, histamine, 1,3-dimethylxanthine, 6-mercaptopurine, 1H-1,2,3-triazole, 1H-1,2,4-triazole, poly-[2,2'-(m-phenylen)-5,5'-bisbenzimidazole], 1H-Pyrrole, 1,3-oxazole, 1,3-thiazole, pyrazole, 1-Methylimidazole, and 4-Methyl-1H-imidazole.

By using the nitrate-based oxidizing agent in the slurry compound, it is possible to polish an SOH organic material, which is generally not sufficiently polished by an oxidizing-agent-free slurry compound. Further, by using a slurry compound containing a polishing accelerator (e.g., imidazole), it is possible to improve a polishing selectivity between the SOH organic material and the metal or nitride layer.

[Chemical Mechanical Polishing Apparatus]

FIG. 1 is a sectional view schematically illustrating a chemical mechanical polishing apparatus.

Referring to FIG. 1, a chemical mechanical polishing apparatus 100 may include a rotation table 110 attached with a polishing pad 112, a polishing head 130 facing the rotation table 110, a slurry supplying part 140 provided adjacent to the polishing pad 112, and a polishing pad conditioner (not shown).

The rotation table 110 may be shaped like a circular disk, and a first driving part 114 may be connected to a bottom of the rotation table 110 to provide a rotating force to the rotation table 110. The polishing pad 112 may be attached on a top surface of the rotation table 110 to polish a to-be-polished surface.

A plurality of pores (not shown) may be formed on a surface of the polishing pad 112. If a slurry compound 142 is supplied during a chemical mechanical polishing (CMP) process on the to-be-polished surface, it may be stored in the pores of the polishing pad 112.

The polishing head 130 may hold a wafer W in such a way that the to-be-polished surface of the wafer W faces the rotation table 110. During the CMP process on the wafer W, the polishing head 130 may be pressed in contact with the to-be-polished surface to the polishing pad 112, and the polishing head 130 may be coupled with a second driving part 120 for rotating the wafer W. The polishing head 130 and the rotation table 110 may have different rotating directions from each other. Alternatively, the polishing head 130 and the rotation table 110 may have the same rotating direction as each other.

Although not shown in detail, an air housing may be formed in the polishing head 130 to hold the wafer W and press the to-be-polished surface of the wafer W onto the polishing pad 112. The air housing may be expanded or contracted to hold the wafer W, and the to-be-polished surface of the wafer W may be pressed onto the polishing pad 112 using the air housing. A retainer ring 132 may be provided on a bottom rim portion of the polishing head 130 to fasten the wafer W. The retainer ring 132 and the wafer W may be in contact with the polishing pad 112, during the CMP process on the wafer W.

The slurry supplying part 140 may supply the slurry compound 142 onto the polishing pad 112. The slurry compound 142 may include the polishing particle, the oxidizing agent, and the polishing accelerator as described above, and therefore, for brevity's sake, a detail description thereof will be omitted.

The polishing pad conditioner may be disposed on the polishing pad 112 and be configured to spray a pressurized vapor onto a surface of the polishing pad 112, thereby improving a surface state of the polishing pad 112.

The following is an example of a CMP process, in which the chemical mechanical polishing apparatus 100 is used to planarize a to-be-polished surface of a wafer W.

The polishing head 130 may hold the wafer W in such a way that the to-be-polished surface of the wafer W faces the polishing pad 112. In example embodiments, the to-be-polished surface may include an SOH organic material. In certain embodiments, the wafer W may further include a metal or a nitride.

The wafer W may be pressed in contact with a rotating top surface of the polishing pad 112. Here, the slurry compound 142 may be supplied from the slurry supplying part 140 onto the polishing head 130. In example embodiments, the slurry compound 142 may be prepared to realize a higher polishing rate of the SOH organic material with respect to a metal or a nitride. The slurry compound 142 may contain the aforedescribed material for the slurry compound 142, and for brevity's sake, a detail description thereof will be omitted.

The slurry compound 142 stored in the pores of the polishing pad 112 and the rotation of the polishing pad 112 may allow the wafer W to be polished chemically and mechanically. By-products may be produced by the polishing of the wafer W, and a mixture of the by-products and the slurry compound 142 may clog the pores of the polishing pad 112.

The mixture of the by-products and the slurry compound 142 may be removed from the pores by the conditioner supplied from the polishing pad conditioner and then may be removed from the polishing pad 112 by the rotation of the polishing pad 112.

[Method of Fabricating a Semiconductor Device]

FIGS. 2A through 2H are sectional views illustrating a method of fabricating a semiconductor device according to example embodiments of the inventive concept.

Figure 2A:
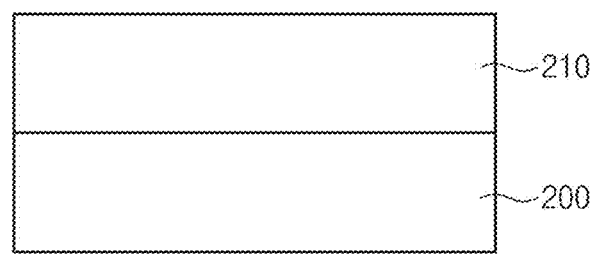
FIGS. 2A through 2H are sectional views illustrating a method of fabricating a semiconductor device according to example embodiments of the inventive concept.

Referring to FIG. 2A, an insulating layer 210 may be formed on a lower structure 200. The insulating layer 210 may include an oxide, a nitride, and/or an oxynitride. In the present embodiment, the insulating layer 210 may be formed of or include a silicon oxide layer.

Although not shown in detail, the lower structure 200 may include a switching device (e.g., a transistor or a diode) or an interconnection structure (e.g., bit lines).

Figure 2B:
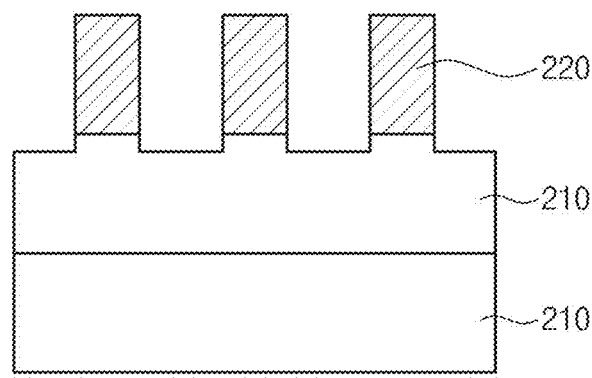

Referring to FIG. 2B, metal lines 220 may be formed on the insulating layer 210. Each of the metal lines 220 may extend in a direction and may include at least one of copper (Cu), aluminum (Al), or tungsten (W).

In example embodiments, the metal lines 220 may be formed by forming sacrificial patterns (not shown) on the insulating layer 210, forming the metal lines 220 to fill gap regions between the sacrificial patterns, and removing the sacrificial patterns.

In other example embodiments, the metal lines 220 may be formed by forming a metal layer (not shown) on the insulating layer 210, forming a mask (not shown) on the metal layer, and etching the metal layer using the mask as an etch mask.

Figure 2C:
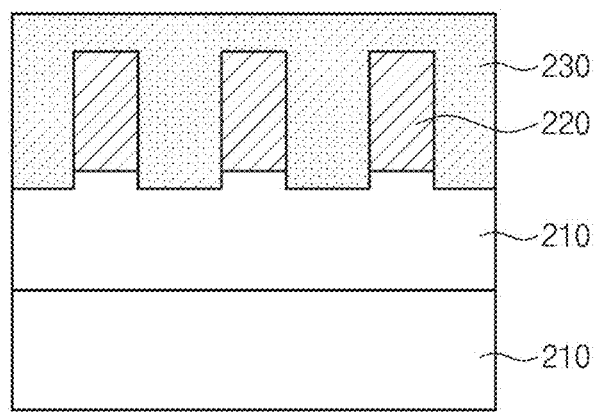

Referring to FIG. 2C, an SOH organic layer 230 may be formed on the metal lines 220 to fill gap regions between the metal lines 220. In example embodiments, the SOH organic layer 230 may be formed to wholly cover the metal lines 220 and have a top surface higher than those of the metal lines 220.

In the case where a general slurry compound is used to polish the SOH organic layer 230, the SOH organic layer 230 may be damaged.

Figure 2D:
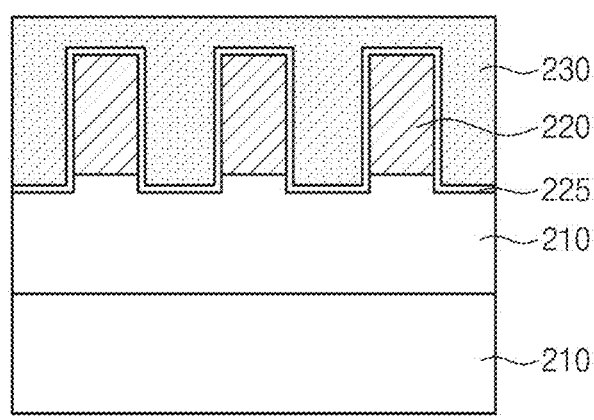

In certain embodiments, as shown in FIG. 2D, a nitride layer 225 may be further formed between the metal lines 220 and the SOH organic layer 230 to prevent a native oxide from being formed on the metal lines 220. For example, the nitride layer 225 may be a silicon nitride layer.

Figure 2E:
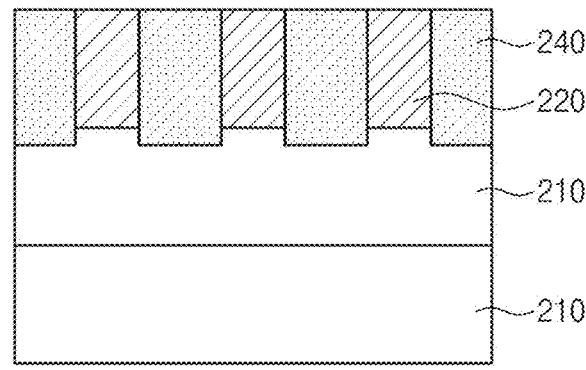

Referring to FIG. 2E, the SOH organic layer 230 may be polished to expose top surfaces of the metal lines 220, and thus, SOH patterns 240 may be formed between the metal lines 220.

In example embodiments, the polishing of the SOH organic layer 230 may be performed by a chemical-mechanical polishing process, in which the slurry compound according to example embodiments of the inventive concept is used. The slurry compound may be selected to allow the SOH organic layer 230 containing the SOH organic material to have a polishing rate different from those of the metal lines 220. For example, when the SOH organic layer 230 is polished, the metal lines 220 may have an extremely low polishing rate and may serve as a polishing-stopping layer.

The slurry compound according to example embodiments of the inventive concept may include the polishing particle, the oxidizing agent, and the polishing accelerator previously described.

In the case where the nitride layer 225 is additionally formed between the metal lines 220 and the SOH organic layer 230, the slurry compound may be selected to allow the SOH organic layer 230 containing the SOH organic material to have a polishing rate different from that of the nitride layer 225. For example, when the SOH organic layer 230 is polished, the nitride layer 225 may have an extremely low polishing rate and may serve as a polishing-stopping layer.

Figure 2F:
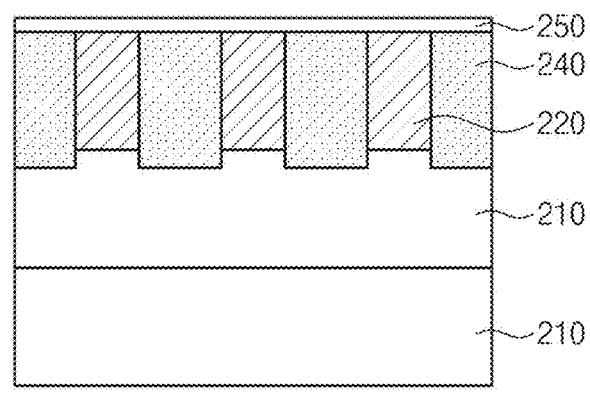

Referring to FIG. 2F, a thin-film 250 may be formed on the metal lines 220 and the SOH patterns 240. A material contained in the thin-film 250 may be variously changed depending on a subsequent process. In example embodiments, the thin-film 250 may include an oxide-based material (e.g., silicon oxide). As an example, the thin-film 250 may be formed of or include an oxide layer formed by a rapid-thermal atomic-layer-deposition (RT ALD) process.

Figure 2G:
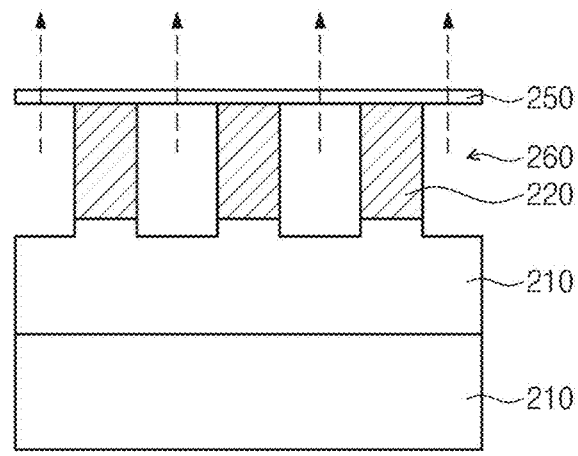

Referring to FIG. 2G, the SOH patterns 240 may be selectively removed. In example embodiments, the SOH patterns 240 may be removed using an oxygen ($O_2$) ashing process. As a result of the removal process, air gaps 260 may be formed between two adjacent ones of the metal lines 220 and may be veiled by the thin-film 250. The metal lines 220 may be electrically separated from each other by the air gaps 260.

As described above, by forming the metal lines 220 and removing the SOH patterns 240 between the metal lines 220, the air gaps 260 can be formed to have a uniform size. In addition, by forming the thin-film 250 before the removal of the SOH patterns 240, it is possible to easily perform a subsequent process of forming upper structures 270.

Figure 2H:
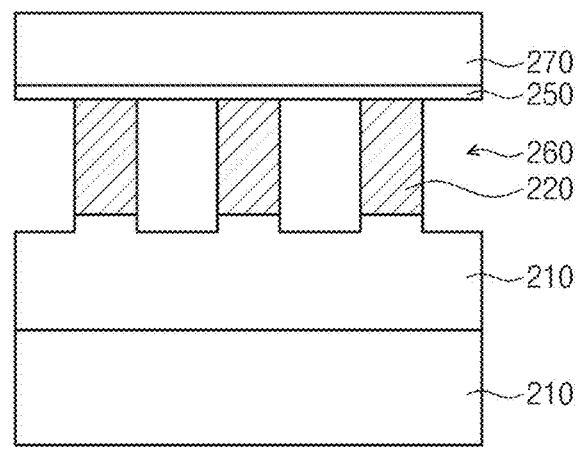

Referring to FIG. 2H, an upper structure 270 may be formed on the thin-film 250. In the case where the thin-film 250 contains oxide, the upper structure 270 may include an oxide layer.

[Experimental Example]

To Select Polishing Particle

The present experiment was performed to select a polishing particle for a slurry compound. In the present experiment, ceria and silica were used as the polishing particles, since they have a different polishing rate compared to an SOH organic layer and a nitride layer. As described above, a nitride layer was formed on metal lines to suppress a native oxide from being formed on the metal lines.

Table 1 shows polishing rates of SOH and SiN layers and an extent of a surface scratch of the SOH organic layer, according to types, shapes, and sizes of materials, which can be used as the polishing particle.

TABLE 1

| Polishing Particle | Shape | Size [nm] | SOH polishing rate [Å/min] | SiN polishing rate [Å/min] | Scratch |
|---|---|---|---|---|---|
| ceria | calcination | 250 | 3,500 | 105 | 310 |
| ceria | calcination | 100 | 2,700 | 60 | 260 |
| ceria | colloid | 60 | 1,300 | 20 | 20 |
| ceria | colloid | 30 | 1,260 | 18 | 15 |
| silica | fumed | 100 | 3,000 | 350 | 32 |
| silica | colloid | 30 | 2,200 | 270 | 13 |

As shown in Table 1, the polishing rate of SiN layer was less than the polishing rate for ceria particles than for silica particles. Compared with the use of the calcination-type of ceria particle, the surface scratch of the SOH organic layer was reduced when the colloid-type of ceria particle was used. This shows that the colloid-type of ceria particle is more suitable as the polishing particle.

To Select Oxidizing Agent

The present experiment was performed to select an oxidizing agent suitable for the slurry compound for polishing an SOH organic layer, when the colloid-type of ceria particle was selected as the polishing particle. Table 2 shows polishing rate and dispersion stability of the SOH organic layer, when some materials for the oxidizing agent were mixed in a slurry compound.

TABLE 2

| Oxidizing Agent | SOH Polishing Rate [Å/min] | Dispersion Stability | Remark |
|---|---|---|---|
| sulfate | 700 | Normal | |
| chlorate | 860 | Aggregation | |
| perchlorate | 760 | Aggregation | |
| chlorine | 710 | Aggregation | |
| nitrate | 1,200 | Normal | |
| peroxide | 210 | Aggregation | Change of color |

As shown in Table 2, sulfate and nitrate had better properties in dispersion stability to the polishing particle, when they were contained in the slurry compound. In particular, the polishing rate of the SOH organic layer was higher when the oxidizing agent of nitrate was used than when the oxidizing agent of sulfate was used, and thus, nitrate was selected as the oxidizing agent.

Figure 3:
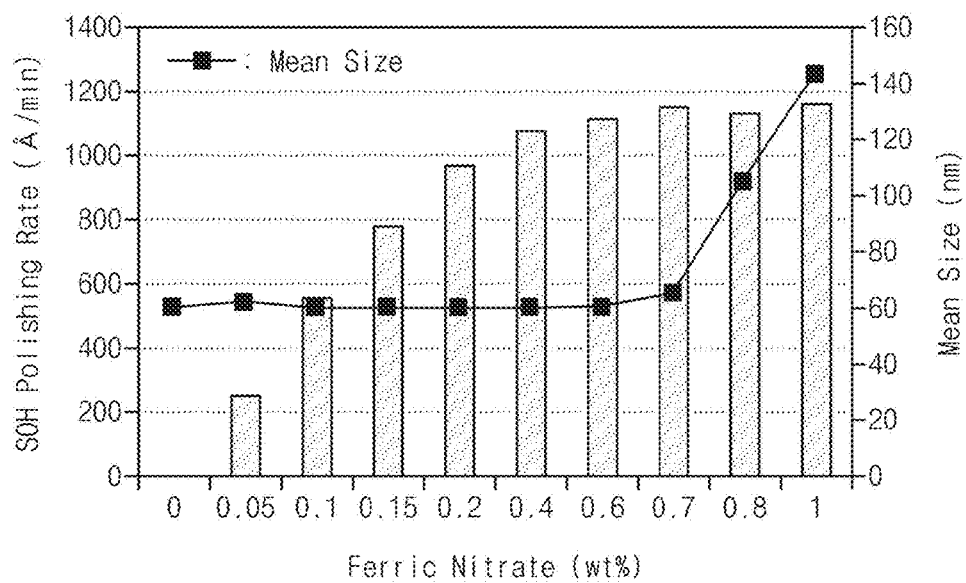
FIG. 3 is a graph showing a polishing rate of an SOH organic layer and a mean size of aggregated polishing particles, when a concentration of ferric nitrate ($FeNO_3$) was changed in the slurry compound.

Table 3 and FIG. 3 show a polishing rate of an SOH organic layer and a mean size of aggregated polishing particles, when a concentration of ferric nitrate ($FeNO_3$) serving as the nitrate for the oxidizing agent was changed in the slurry compound.

TABLE 3

| $FeNO_3$ [wt %] | SOH Polishing Rate [Å/min] | Mean Size [nm] |
|---|---|---|
| 0.00 | 0 | 60 |
| 0.15 | 250 | 62 |
| 0.10 | 560 | 60 |
| 0.15 | 780 | 60 |
| 0.20 | 970 | 60 |
| 0.40 | 1,080 | 60 |
| 0.60 | 1,200 | 60 |
| 0.70 | 1,150 | 65 |
| 0.80 | 1,130 | 105 |
| 1.00 | 1,160 | 143 |

As shown in Table 3 and FIG. 3, the higher the concentration of the ferric nitrate, the higher the polishing rate of the SOH organic layer. However, if the ferric nitrate of 0.80 wt % or higher was used, the mean size of the aggregated polishing particles was increased, and from this, it was preferable that the oxidizing agent in the slurry compound have a concentration ranging from about 0.2 wt % to about 0.7 wt %.

To Select Polishing Accelerator

The present experiment was performed to select a polishing accelerator for a slurry compound. Table 4 shows polishing rates of an SOH organic layer and a copper line, when some materials for the polishing accelerator were contained in a slurry compound to have a concentration of 0.2 wt %.

TABLE 4

| Compound | Polishing Rate [Å/mm] | | |
|---|---|---|---|
| (0.2 wt %) | SOH | Cu | Remark |
| carboxylic acid | 470 | 210 | Aggregation |
| histidine | 2,700 | 330 | |
| glycine | 2,650 | 310 | |
| imidazole | 2,810 | 28 | |
| formic acid | 1,230 | 295 | |
| inorganic acid | 120 | 105 | |

As shown in Table 4, when histidine, glycine, and imidazole were used as the polishing accelerator, the SOH organic layer had a polishing rate of 2,500 Å/min or higher. However, when histidine and glycine were used, the copper line had a polishing rate of 300 Å/min or higher, whereas when imidazole was used, the copper line had a very low polishing rate of 28 Å/min. This shows that an azole-based material is suitable for the polishing accelerator.

Figure 4:
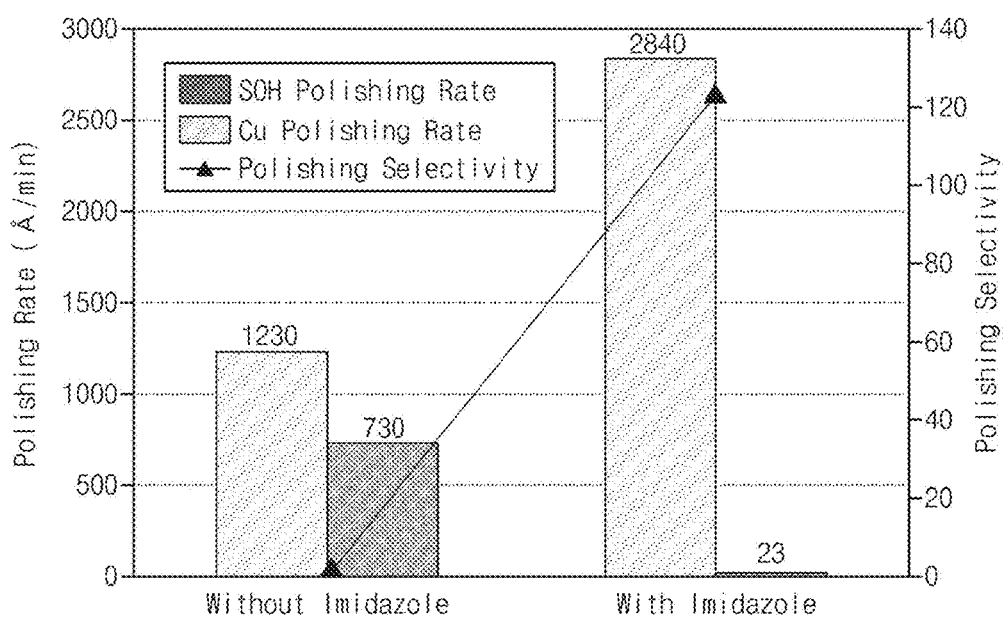
FIG. 4 is a graph showing polishing rates of an SOH organic layer and a copper line, when imidazole-containing and imidazole-free slurry compounds were used to polish the SOH organic layer and the copper line formed on a substrate.

FIG. 4 is a graph showing polishing rates of an SOH organic layer and a copper line, when imidazole-containing and imidazole-free slurry compounds were used to polish the SOH organic layer and the copper line formed on a substrate.

Referring to FIG. 4, in the case that the imidazole-free slurry compound was used to polish an SOH organic layer formed on a copper line, the SOH organic layer had a polishing rate of about 1,230 Å/min and the copper line had a polishing rate of about 730 Å/min. That is, a polishing selectivity therebetween was very low, about 1.68.

By contrast, in the case that the imidazole-containing slurry compound was used to polish an SOH organic layer formed on a copper line, the SOH organic layer had a polishing rate of about 2,840 Å/min and the copper line had a polishing rate of about 23 Å/min. That is, a polishing selectivity therebetween was remarkably increased to about 123.5.

Figure 5A:
FIG. 5A is an image taken from a polished surface of a copper line, when a conventional (i.e., polishing-accelerator-free) slurry compound was used to polish an SOH organic layer.
Figure 5B:
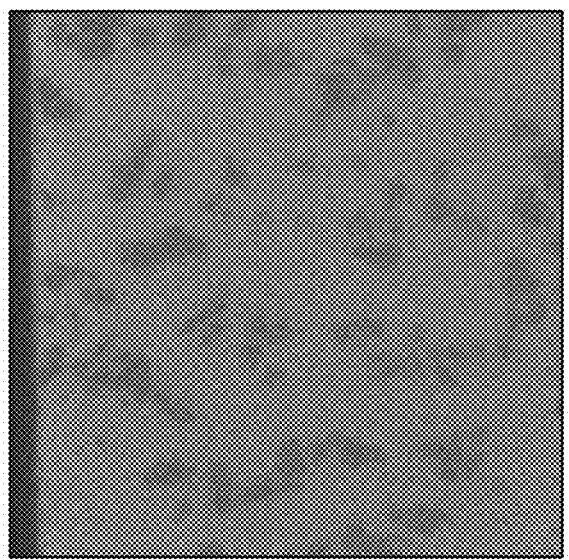
FIG. 5B is an image taken from a polished surface of a copper line, when a slurry compound including imidazole as a polishing accelerator was used to polish an SOH organic layer.

FIGS. 5A and 5B are images taken from polished surfaces of copper lines, after a polishing process. The image of FIG. 5A was taken from a polishing process, in which a conventional (i.e., polishing-accelerator-free) slurry compound was used to polish an SOH organic layer, and the image of FIG. 5B was taken from another polishing process, in which the slurry compound according to example embodiments (i.e., including imidazole as a polishing accelerator) was used.

According to the present embodiment, in the case where the polishing accelerator such as imidazole is used, it is possible to increase a polishing rate of an SOH organic layer, and imidazole may be adsorbed on a surface of a metal layer (e.g., of copper), thereby protecting the surface of the metal layer against the polishing process.

The surface shown in FIG. 5B exhibited an improved corrosion property, compared to that shown in FIG. 5A. When the imidazole or the polishing accelerator is contained in the slurry compound, the presence of the imidazole adsorbed on surfaces of the copper lines led to more difficulty in making contact between the oxidizing agent and the surfaces of the copper lines, leading to a reduction in corrosion of the copper line, as shown in FIG. 5B.

According to example embodiments of the inventive concept, a slurry compound may be prepared to include an oxidizing agent containing at least one selected from the group consisting of nitrate, sulfate, chlorate, perchlorate, chlorine, and peroxide, and the use of the slurry compound may make it possible to polish an SOH organic layer with efficiency. Further, the slurry compound may contain a polishing accelerator, allowing the SOH organic layer to be polished with a high polishing selectivity with respect to metal lines.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming metal lines on a substrate;
    forming an organic layer on the metal lines to fill gaps between the metal lines, wherein the organic layer covers a top surface of the metal lines;
    performing a polishing process on the organic layer to expose the top surface of the metal lines and form organic patterns between the metal lines;
    forming a thin film on the metal lines to extend onto the organic patterns; and
    selectively removing the organic patterns to form air gaps between the metal lines,
    wherein the polishing process is performed using a slurry compound comprising (a) a polishing particle, (b) an oxidizing agent containing at least one selected from the group consisting of a nitrate, a sulfate, a chlorate, a perchlorate, a chlorine, and a peroxide, and (c) at least one selected from the group consisting of histidine, glycine, glutamine, leucine, methionine, phenylalanine, tryptophan, valine, imidazole, imidazolium, chloride, pyridine, tetrazoles, histamine, 1,3-dimethylxanthine, 6-mercaptopurine, 1H-1,2,3-triazole, 1H-1,2,4-triazole, poly-[2,2'-(m-phenylen)-5,5'-bisbenzimidazole], 1H-pyrrole, 1,3-oxazole, 1,3-thiazole, pyrazole, 1-methylimidazole, and 4-methyl-1H-imidazole.

2. The method of claim 1, wherein, during the polishing process on the organic layer, at least one selected from the group consisting of histidine, glycine, glutamine, leucine, methionine, phenylalanine, tryptophan, valine, imidazole, imidazolium, chloride, pyridine, tetrazoles, histamine, 1,3-dimethylxanthine, 6-mercaptopurine, 1H-1,2,3-triazole, 1H-1,2,4-triazole, poly-[2,2'-(m-phenylen)-5,5'-bisbenzimidazole], 1H-pyrrole, 1,3-oxazole, 1,3-thiazole, pyrazole, 1-methylimidazole, and 4-methyl-1H-imidazole of the slurry compound is adsorbed on the top surface of the metal lines.

3. The method of claim 1, wherein the polishing particle comprises colloidal ceria ($CeO_2$) particles.

4. The method of claim 1, wherein the polishing particle has a size in a range from about 30 nm to about 80 nm.

5. The method of claim 1, wherein the oxidizing agent is present in an amount in a range from about 0.2 wt % to about 0.7 wt % with respect to a total weight of the slurry compound.

6. The method of claim 1, wherein the oxidizing agent comprises at least one of hydrogen peroxide, ammonium perchlorate, sodium chlorate, sodium chlorite, or ferric nitrate.

7. The method of claim 1, wherein removing the organic patterns is performed using an ashing process, wherein the air gaps are veiled by the thin film during the ashing process.

* * * * *